United States Patent [19]

Avara et al.

[11] 4,252,398
[45] Feb. 24, 1981

[54] ELECTRIC POWER METER

[75] Inventors: Teddy W. Avara; James A. Dixon, both of Clinton, Mich.

[73] Assignee: Mississippi Power and Light Company, Jackson, Mich. ; a part interest

[21] Appl. No.: 31,872

[22] Filed: Apr. 20, 1979

[51] Int. Cl.³ .................. G01R 11/24; H01R 13/645
[52] U.S. Cl. .............................. 339/184 M; 339/31 B; 361/369; 361/372
[58] Field of Search .......... 339/184 R, 184 M, 186 R, 339/186 M, 258 F, 259 F, 31, 36, 37, 259 R, 192 R, 192 L; 324/110, 156; 361/364, 369, 370, 372–375

[56] References Cited

U.S. PATENT DOCUMENTS

| | | | |
|---|---|---|---|
| 3,004,236 | 10/1961 | Dickenson et al. | 339/186 M X |
| 3,076,953 | 2/1963 | Sloop | 339/259 F |
| 3,184,707 | 5/1965 | Anderson | 339/186 M |
| 4,034,290 | 7/1977 | Warren | 324/110 |
| 4,104,588 | 8/1978 | Westberry | 339/184 M X |
| 4,108,531 | 8/1978 | Reynolds | 339/259 F X |

Primary Examiner—Eugene F. Desmond
Attorney, Agent, or Firm—Cushman, Darby & Cushman

[57] ABSTRACT

A method and means for preventing reversal of the orientation of an electric utility meter in its base socket. A first tab is attached to the rear face of the meter and a second tab is attached to the front face of the base such that a conflict between the two tabs develops if reversed assembly of the meter and socket base is attempted. In one embodiment of the invention, the first tab, consisting of a short metal rod, is welded to a vertical edge of one of the meter plugs and the second tab, consisting of a metal sleeve, is mounted to the base socket receptacle which is diagonally opposite to the receptacle in which the tabbed plug normally fits.

4 Claims, 7 Drawing Figures

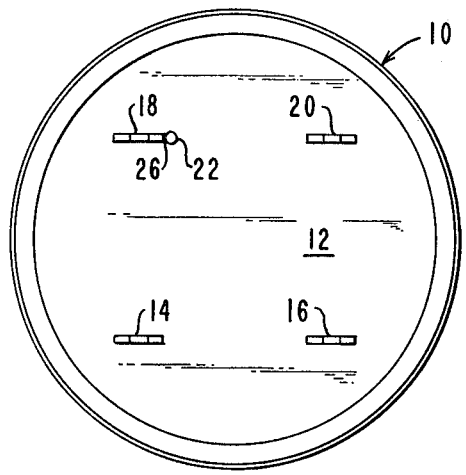
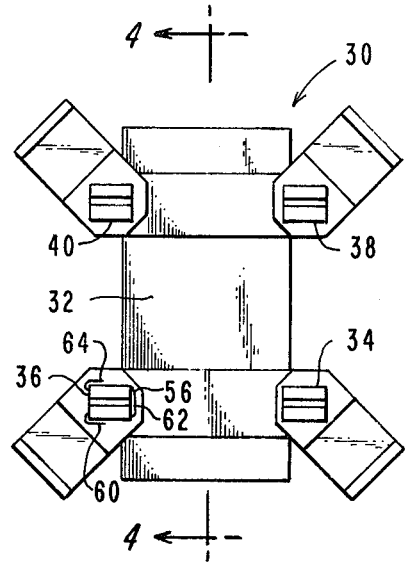
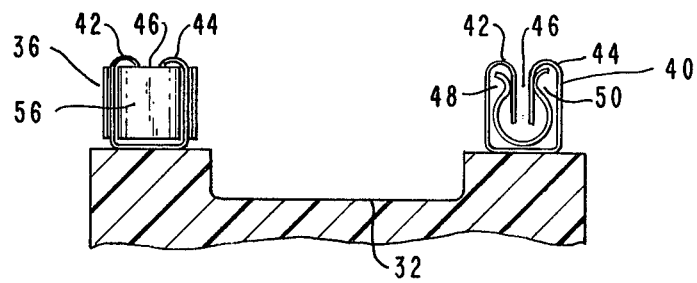
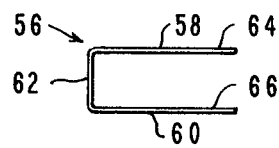
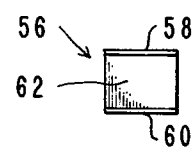
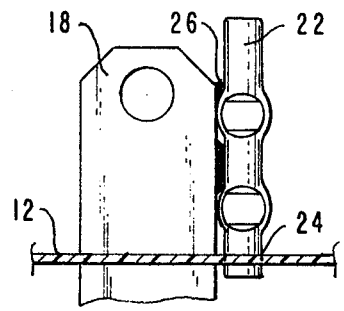
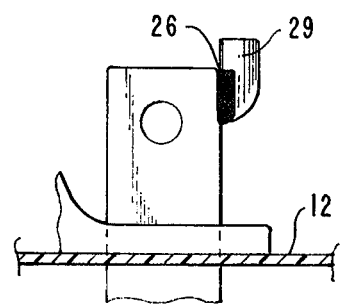

ELECTRIC POWER METER

BACKGROUND AND SUMMARY OF THE INVENTION

The invention relates to electric utility meters and more particularly to a method and means of preventing reversal of the orientation of the meter in its base socket.

Theft of electricity has always been a problem and the problem has been growing in magnitude due to the increasing cost of electrical energy. One method of stealing electricity is to reverse the orientation of the electric utility meter with respect to the meter base socket so that the values displayed on the meter are caused to decrease with continued electricity usage. This reversal is generally possible because most meter and socket assemblies have four identical and vertically symmetrical plugs and four identical and vertically symmetrical receptacles which are respectively disposed at the corners of a rectangle.

A number of approaches to prevent reversal of the electric utility meter in its socket have been used. For example, one approach is to arrange the meter plugs and base receptacles in an asymmetric manner so that the meter may be assembled in one orientation only. Such an approach is disclosed in U.S. Pat. No. 4,034,290, issued to Warren. Another approach is to make each plug and receptacle asymmetrical. These approaches, however, have a significant disadvantage in that a totally new meter is required. Thus, in an old installation, the old meter must be replaced, and the base must be replaced or modified.

The present invention overcomes this disadvantage by providing a method and means for preventing standard new or in service electric meters from being reversely assembled in their base sockets. In accordance with this approach, a small member (tab) such as a metal rod is fixed to the meter, suitably adjacent to one of the meter plugs, so as not to interfere with the normal upright insertion of all the meter plugs in their corresponding receptacles. A second member (tab) such as a thin metal sleeve is attached to the base socket, suitably adjacent to the socket receptacle corresponding to the diagonally opposite meter plug, also so as not to interfere with the upright insertion of all the meter plugs in their corresponding receptacles. However, the placement of the second member on the base socket is such that reverse assembly is blocked and prevented by the second member intersecting the first member when reverse assembly is attempted.

This modification to the meter assembly in accordance with the present invention may be accomplished at the site of an installed meter with just a few minutes of labor. Great flexibility is preserved by the fact that the meter rod need only be adapted to the respective meter to which it is mounted, and the base socket sleeve need only be adapted to the respective base socket to which it is to be mounted, so that the two tabs may therefore be installed independently. Another advantage of the invention is that the meter rods and base socket sleeves are inexpensively manufactured. This method and means of electricity theft protection is also advantageous since the tabs are light weight and small in size and therefore easy to carry in service vehicles.

BRIEF DESCRIPTION OF THE DRAWINGS

Other features, objectives and advantages of the present invention will be apparent from the following detailed description of the preferred embodiment with reference to the appended figures, wherein like elements are identified with the same numerals, in which:

FIG. 1 is a plan view of the rear surface of an electric meter with a small rod attached to one meter plug in accordance with the one embodiment of the invention;

FIG. 2 is an enlarged elevation of the plug with small rod attached shown in FIG. 1;

FIG. 3 is a plan view of a base socket adapted to receive the meter shown in FIG. 1 having a thin metal sleeve inserted in preexisting crevices in one of the plug receptacles;

FIG. 4 is an enlarged elevation of the socket receptacle with sleeve attached shown in FIG. 3;

FIG. 5 is a plan view of a sleeve in accordance with the invention;

FIG. 6 is a side elevation of the sleeve illustrated in FIG. 5; and

FIG. 7 is an elevation of a modified meter plug in accordance with the invention.

DETAILED DESCRIPTION OF THE PREFERRED EMBODIMENT

Referring first to FIG. 1, there is shown a rear face of a standard electric utility meter generally identified by the numeral 10. Disposed on the Bakelite rear surface 12 are four plugs 14, 16, 18 and 20 arranged at the corners of a rectangle. As is best illustrated in FIG. 2, a first member, suitably metal rod 22, is inserted through hole 24 in the Bakelite rear surface 12 adjacent to plug 18, aligned parallel to edge 26 of plug 18 and welded thereto. Rod 22 suitably extends from just below hole 24 to just above the top edge 28 of plug 18. Typically, rod 22 consists of a one-inch long strip of Number 6 copper round rod. For those electric meters for which the use of a rod such as rod 22 cannot be utilized, a plate shaped member, such as member 29, welded directly to the top portion of plug edge 26 may be utilized, as is illustrated in FIG. 7.

Referring now to FIG. 3, there is shown a meter socket base generally identified by the numeral 30 having a front base 32 and four receptacles 34, 36, 38 and 40 respectively disposed thereon at the corners of a rectangle and arranged to receive meter plugs 14, 16, 18 and 20. As is best illustrated in FIG. 4, each receptacle extends vertically from socket front surface 32 and includes two spaced apart parallel lugs 42 and 44 having a space therebetween 46 for receiving meter plugs 14, 16, 18 and 20. Lugs 42 and 44 respectively contain crevices 48 and 50 which run parallel to space 46. Receptacle 36, which is diagonally opposite receptacle 38 which receives plug 18 to which rod 22 is mounted, has a U-shaped sleeve 56 mounted thereto. As is best illustrated in FIGS. 5 and 6, sleeve 56 has two arm portions 58 and 60 and a bridging portion 62. When mounted to receptacle 36 sleeve arm portions 58 and 60 are respectively inserted in crevices 48 and 50 so that their end portions 64 and 66 extend completely through the crevices 48 and 50. Sleeve ends 64 and 66 are then bent, as by the blow of a hammer, to permanently secure the sleeve in its position. The meter base sleeve 56 suitably consists of a length of stainless steel which has been cut and placed in a metal press to preform to a shape for easy insertion in the crevices 48 and 50 of the receptacle lugs 42 and 44. The particular shape of the sleeve 56 may, of course, be varied depending on the particular receptacle design.

Without both rod 22 and sleeve 56 respectively fixedly mounted to meter 10 and socket base 30, it would be possible to uprightly assemble the meter assembly as described above, or reversely assemble the meter assembly so that meter plugs 14, 16, 18 and 20 are respectively inserted in receptacles 40, 38, 36 and 34. However, with members 22 and 56 mounted as described, any attempt to reversely assemble the meter will be blocked by the intersection of rod 22 with bridge portion 62 of sleeve 56. It will be apparent to those skilled in the art that other suitable shapes of sleeve 56 and rod 22 may be required depending on the particular design of the meter and base socket.

Although only two embodiments of the invention have been disclosed in detail for illustrative purposes, it will be understood that variations or modifications of the disclosure which lie within the scope of the appended claims are fully contemplated. For example, while attachment of members to one plug and one receptacle is a suitable means for blocking the reverse assembly of the meter assembly, any attachment of one member to the front surface of the socket base whereby the two members do not interfere with the upright assembly of the meter assembly but which block and prevent reverse assembly of the meter assembly are considered to be fully within the scope of the present invention. These and other modifications can be made in the design and arrangement of the elements as will be apparent to those skilled in the art, without departing from the scope of the invention as expressed in the appended claims.

We claim:

1. In an electric meter assembly including a meter with four plugs disposed on a meter rear surface and a base socket with four meter receptacles disposed on the socket front face, said four receptacles being adapted for receiving said four meter plugs when said meter is in an upright or in a reverse orientation, each of said four receptacles including a pair of spaced parallel aligned lugs, each of said lugs being disposed on said front surface and having a crevice therein, the crevices in each lug pair being spaced and parallel aligned to form a crevice pair, the improvement comprising:

a metal rod disposed adjacent one of said four plugs extending perpendicularly to said rear surface and welded to said one plug, and a U-shaped sleeve inserted in the crevices of one of said receptacles so as to bridge said one receptacle crevice pair, said one of said four receptacles receiving another of said four plugs, said another of said four plugs being disposed diagonally across from said one of said four plugs, said metal rod and said U-shaped sleeve cooperating to block said four receptacles from receiving said four meter plugs when said meter is in a reverse orientation, said four socket receptacles receiving said four meter plugs when said meter is an upright orientation.

2. A method for preventing reversed assembly of an electric power meter and power meter socket base, the meter having four rectangularly spaced plugs, the socket base having a front face and four rectangularly spaced receptacles adapted to receive the meter plugs with the meter in either an upright or reverse orientation relative to the base socket, each of said four receptacles including a pair of spaced parallel aligned lugs, each of said lugs being disposed on said front surface and having a crevice therein, the crevices in each lug pair being spaced and parallel aligned to form a crevice pair; said meter and socket, when uprightly assembled or reversely assembled, defining a first space adjacent one of said receptacles, and a second space diagonally opposite said first space, said second space being adjacent another of said receptacles diagonally opposite said one of said receptacles, said method comprising the steps of:

fixedly mounting a first member to said meter adjacent one of said four plugs, said first member being disposed in said first space when said meter and socket are uprightly assembled; and fixedly mounting a second member to said socket base adjacent said another receptacle and being disposed in said second space when said meter and socket are uprightly assembled such that said second member will intersect said first member to prevent reverse assembly of said socket and meter if reverse assembly is attempted; said second member comprising a U-shaped metal sleeve;

said step of mounting said second member comprising the steps of:

inserting said sleeve in said crevice pair of said another receptacle such that said sleeve forms a bridge portion bridging said another receptacle crevice pair so that said bridge portion intersects said first member to prevent reverse assembly if reverse assembly is attempted; and bending said sleeve to fix said sleeve to said another receptacle.

3. Method as in claim 2 wherein said step of mounting said first member includes the step of welding said first member to said one plug.

4. Method as in claim 3 wherein said first member comprises a metal rod and said step of mounting said first member includes the steps of:

forming a hole in the rear surface of the meter adjacent said one plug;

inserting said rod through said hole; and aligning said rod with said one plug.

* * * * *